United States Patent [19]

Jelinek et al.

[11] Patent Number: 5,331,295
[45] Date of Patent: Jul. 19, 1994

[54] VOLTAGE CONTROLLED OSCILLATOR WITH EFFICIENT PROCESS COMPENSATION

[75] Inventors: Jules J. Jelinek, San Francisco; Jay Deng, San Jose, both of Calif.

[73] Assignee: National Semiconductor Corporation, Santa Clara, Calif.

[21] Appl. No.: 12,600

[22] Filed: Feb. 3, 1993

[51] Int. Cl.⁵ ............................................. H03K 3/354
[52] U.S. Cl. .......................................... 331/57; 331/17
[58] Field of Search ..................................... 331/57, 17

[56] References Cited

U.S. PATENT DOCUMENTS

| | | | |
|---|---|---|---|
| 4,015,219 | 3/1977 | Kawagoe et al. | 331/57 |
| 4,072,910 | 2/1978 | Dingwall et al. | 331/57 |
| 4,714,900 | 12/1987 | Sata | 331/17 |
| 4,987,373 | 1/1991 | Soo | 328/155 |
| 5,061,907 | 10/1991 | Rasmussen | 331/57 |
| 5,136,260 | 8/1992 | Yocousefi-Elezei | 331/17 |

*Primary Examiner*—Andrew M. Dolinar
*Attorney, Agent, or Firm*—Flehr, Hohbach, Test, Albritton & Herbert

[57] ABSTRACT

A voltage controlled oscillator (VCO) provides an output signal with an output frequency that varies only minimally for any given input control voltage despite variations in the manufacturing process, temperature and supply voltage. The VCO also includes a multistage ring oscillator which includes a plurality of series-connected current-starved inverter stages. The VCO utilizes a first current source to provide a substantially constant current independent of process, temperature and supply voltage and a second current source to provide a variable current that varies in response to process, temperature and supply voltage. Both current sources generate a respective current signal independent of the input signal to the VCO. An attenuator, responsive to the VCO's input voltage signal (typically from a phase-locked loop filter) provides a control current signal to the ring oscillator. The attenuator receives a supply current created by subtracting the second current from the first current, and utilizes a differentiation subcircuit that attenuates the supply current in response to changes in an input voltage to produce a current control signal that sets the current level in the ring oscillator's cells. The frequency of oscillation of the ring oscillator is determined by the control current signal. Additionally, the VCO circuit may include a current mirror for receiving the control current signal from the attenuator and mirroring the control current signal to the ring oscillator.

13 Claims, 2 Drawing Sheets

VOLTAGE CONTROLLED OSCILLATOR WITH EFFICIENT PROCESS COMPENSATION

The present invention relates generally to voltage controlled oscillators and particularly to methods and systems for obtaining a well-controlled output range over varying temperature, process and supply voltage.

BACKGROUND OF THE INVENTION

The present invention is a voltage controlled oscillator (VCO) designed to automatically compensate for processing, temperature and voltage supply variations. A patent assigned to National Semiconductor Corporation and issued to Rasmussen, U.S. Pat. No. 5,061,907, had similar goals, but achieves process, temperature and voltage supply immunity using somewhat different techniques from the present invention.

In summary, Rasmussen discloses a VCO that includes a multistage ring oscillator, a voltage-to-current converter, process compensation circuitry, and a trip-point compensation circuit. The voltage-to-current converter linearly converts the input signal (typically from a phase-locked loop filter) to an output current signal that is independent of the transistors in the ring oscillator, i.e., independent of varying temperature and process. Thus, the linear voltage-to-current converter in Rasmussen provides a variable control current rather than a constant current source as used by the present invention. The process compensation circuitry in Rasmussen responds to the tuning voltage input signal to provide a current dump output signal that is dependent on transistor strength, i.e., dependent on temperature, process and supply voltage. The trip-point compensation circuit in Rasmussen generates a net current created by subtracting the process compensation current from the current generated by the voltage-to-current converter, and then steers a variable percentage of that net current to the ring oscillator in accordance with the strength of the N- and P- channel transistors in the device.

The output currents from both the voltage-to-current converter and the process compensation circuitry in Rasmussen are dependent on the tuning voltage input signal. The dependence of the process compensation circuitry on the tuning voltage input signal, however, can create an unstable current dump output signal. The present invention avoids this dependence by providing a current source and a process compensation circuit that are not dependent on the tuning voltage input signal.

Thus, it is an object of the present invention to provide a VCO where process spread, temperature and supply voltage variation has minimal effect on output frequency and the open loop gain of the VCO.

SUMMARY OF THE INVENTION

In summary, the present invention is a VCO where process spread, temperature and supply voltage variations have minimal effect on output frequency. The VCO also includes a multistage ring oscillator that includes a plurality of series-connected current-starved inverter stages. The VCO utilizes a first current source to provide a substantially constant current independent of process, temperature and supply voltage and a second current source to provide a variable current that varies in response to process, temperature and supply voltage. Both current sources generate a respective current signal independent of the input signal to the VCO.

An attenuator, responsive to the VCO's input voltage signal (typically from a phase-locked loop filter) provides a control current signal to the ring oscillator. The attenuator receives a supply current created by subtracting the second current from the first current, and utilizes a differentiation subcircuit that attenuates the supply current in response to changes in an input voltage to produce a current control signal that sets the current level in the ring oscillator's cells. The frequency of oscillation of the ring oscillator is determined by the control current signal. Additionally, the VCO circuit may include a current mirror for receiving the control current signal from the attenuator and mirroring the control current signal to the ring oscillator.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
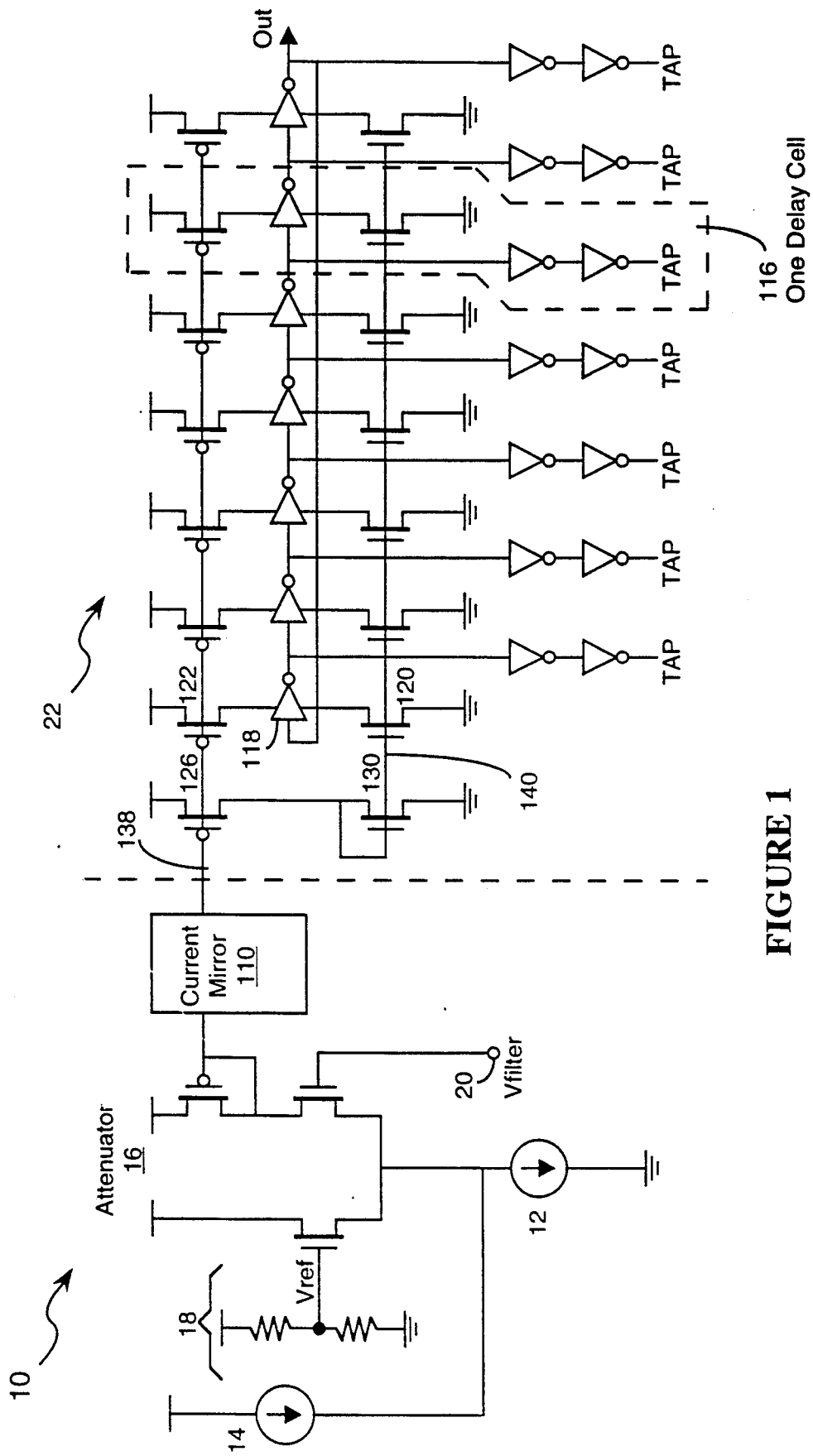
FIG. 1 is a generalized circuit diagram of a preferred embodiment of the present invention.

Referring to FIG. 1, there is shown a preferred embodiment of a VCO 10 that employs first and second current sources 12 and 14, attenuator 16, reference voltage 18, an input voltage node 20 (which typically receives a control voltage from the loop filter of a phase-locked loop) and a multistage ring oscillator 22. Attenuator 16 is coupled to the outputs of both first and second current sources 12 and 14, reference voltage 18, and input voltage 20. The output of attenuator 16 is coupled to ring oscillator 22.

Figure 2:
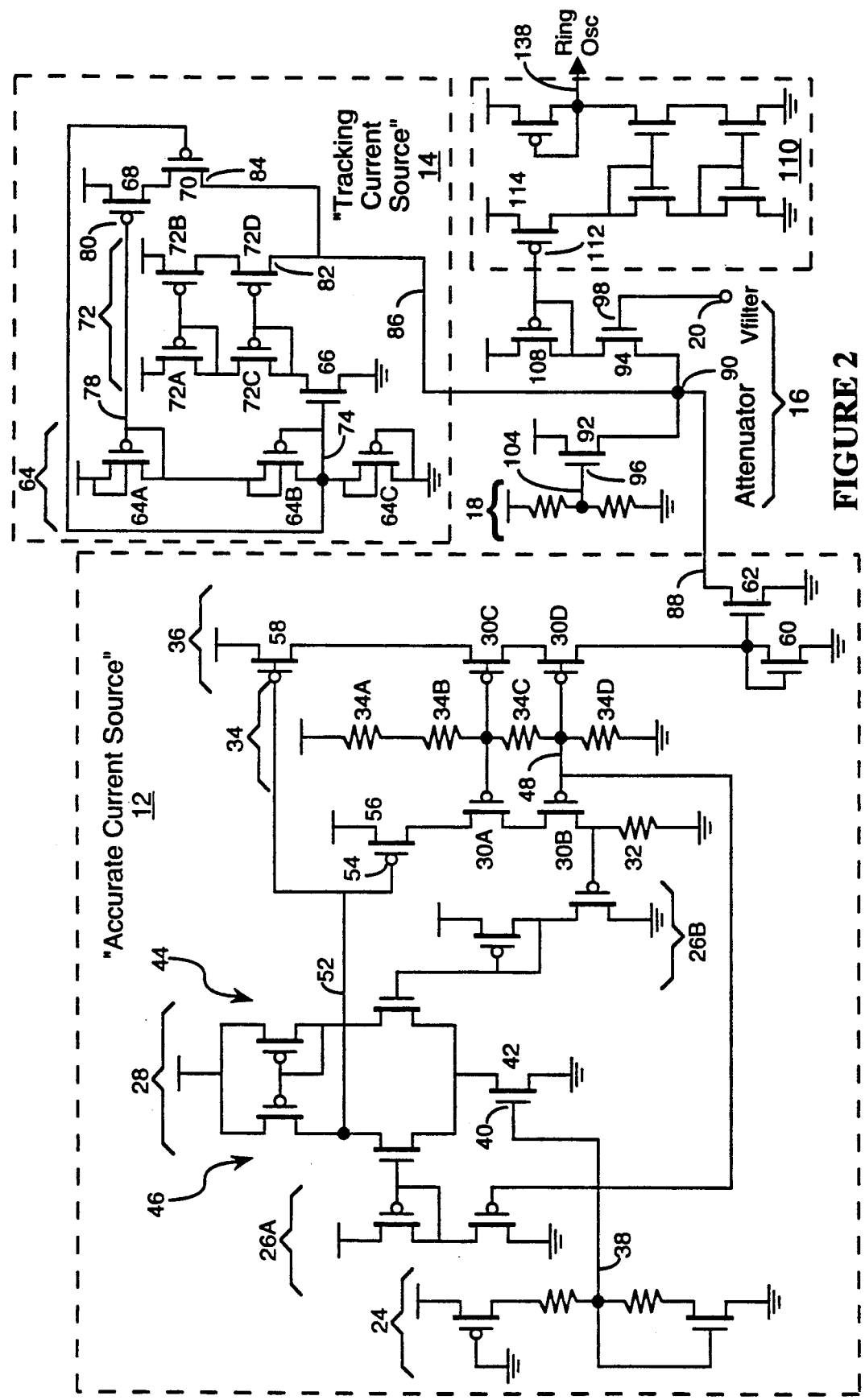
FIG. 2 is a detailed circuit diagram of a preferred embodiment of the present invention.

First current source 12, also called the "good" or "accurate" current source, provides a substantially constant current that is independent of process, temperature and supply voltage. First current source 12 shown in FIG. 2 is a feedback current source utilizing a precision lithography resistor 32. As shown in FIG. 2, first current source 12 is formed by a reference voltage source 24, level shifters 26A and 26B, amplifier 28, "voltage headroom" spacers 30A, 30B, 30C, 30D, precision current setting resistor 32, resistor stack 34 and current mirror 36.

The output 38 of reference voltage source 24 is coupled to gate 40 of N-channel transistor 42, which provides the current source for amplifier 28. The combination of the voltage source 24 and transistor 42 provide a space efficient current reference (for the amplifier 28) accurate to within +/−37% for the expected range of process, temperature and supply voltage variations. The loss stage 44 of amplifier 28 is also coupled to precision current setting resistor 32 via level shifter 26B. A wide lithography resistor is used to implement precision resistor 32, thereby making it less sensitive to lithography processing variations. The gain stage 46 of amplifier 28 is coupled to node 48 of resistor stack 34 via level shifter 26A. Resistor stack 34 is formed by resistors 34A, 34B, 34C, 34D connected in series which create a precise $V_{DD}/4$ voltage reference at node 48. The level shifters 26A and 26B indirectly reduce current and power consumption by the good current source circuit 12 because the voltage level shift accomplished by these shifters allows a smaller current to be supplied to the precision resistor 32 to achieve a specified voltage reference level to the amplifier 18.

The output 52 of amplifier 28 is coupled to gate 54 of P-channel transistor 56 which generates a current in response to the amplifier 28 output. This current is mirrored by current mirror 36. P-channel transistor 58 and N-channel transistors 60 and 62 form current mirror 36. The current flowing through transistors 56 and 58 govern the output of the current source 12. Spacers 30A and 30B minimize lambda modulation (which would otherwise diminish accuracy of the first current source 12) of the drain node voltage of P-channel transistor 56, and spacers 30C and 30D do the same for P-channel transistor 58.

The first current source 12 provides a current level accurate to within approximately $+/-11$ percent over the expected range of process, temperature and supply voltage. Other current sources may be used in place of the first current source 12, such as a band gap current source which is more accurate but less efficient than first current source 12. However, any acceptable alternate embodiment of the first current source should provide a substantially constant current source with accuracy as good or better than the preferred embodiment.

Second current source 14, also called the "tracking" current source, provides a variable current that varies in response to process, temperature and supply voltage. As shown in FIG. 2, second current source 14 is formed by reference voltage source 64, N-channel transistor 66, P-channel transistor 68, spacer 70 and current mirror 72. Reference voltage source 64 is a voltage divider formed by three P-channel transistors 64A, 64B, 64C connected in series, which divides a supply voltage $V_{DD}$ by three. Other components such as resistors may be used to form voltage divider 64, but the series connected P-channel transistors are more space efficient.

The output of reference voltage source 64, on node 74, is coupled to the gate of N-channel transistor 66. Thus, the voltage at gate 76 of N-channel transistor 66 is $V_{DD}/3$. The output of reference voltage source 64, on node 78, is coupled to gate 80 of P-channel transistor 68. Thus, the voltage at gate 80 of P-channel transistor 68 is $2V_{DD}/3$.

As P-channel strength increases (i.e., with changes in the manufacturing process, such as changes in doping levels, lithography variations, or other changes in the circuit profile), the currents in P-channel transistors 68 and 70 increase proportionally. Likewise, as N-channel strength increases, the currents in N-channel transistor 66 and P-channel transistors 72A, 72B, 72C, 72D in current mirror 72 increases.

N-channel transistor 66 and P-channel transistor 68 are sized (at a so-called ideal process ratio of 3:1 in the preferred embodiment) such they output equal amounts of current at the ideal "center" process and temperature for the circuit. As a result, each transistor supplies approximately half of the output current of current source 14 that is supplied to node 86 under ideal process conditions. Spacer 70 is provided to prevent or minimize lambda modulation of the drain voltage and current flowing through transistor 68.

Current through N-channel transistor 66 is mirrored by current mirror 72. The use of cascoded transistors 72A and 72C above transistor 66 minimizes lambda modulation of the current through N-channel transistor 66. Thus, the ½ current contributed by N-channel transistor 66 is output from source 82 of P-channel transistor 72D. The ½ current contributed by P-channel transistor 68 is output from drain 84 of spacer 70. The N-channel and P-channel currents combine at node 86 to generate the total current output from second current source 14.

Second current source 14 varies its output current proportionately with the strength of the P- and N- channel transistors in the circuit. This dependence enables the attenuator circuit 16, discussed next, to track the current needs of the current starved inverters in the ring oscillator 22 to generate a given frequency.

Attenuator 16 is coupled to the output (node 88) of the first current source 12 and the output of the second current source 14 (node 86) at node 90. The connection of the two current sources at node 90 in attenuator 16 results in the supply current provided to attenuator 16 being the output of the second current source subtracted from the output of the first current source. As a result, the supply current provided on node 90 to the attenuator 16 is inversely related to variations in process, temperature and supply voltage. Thus, the net current in the attenuator 16 at node 90 varies inversely with the current that would flow through a single MOS transistor at the same operating conditions.

The combined or net current on node 90 would enable ring oscillator 22 to oscillate at or near a desired frequency, for example, 50 Mhz. However, an adjustable current is needed to set the ring oscillator 22 to a desired frequency. Generating the required adjustable current is accomplished by splitting the current on node 90 into first and second split currents, with the relative sizes of the two split currents being determined by the difference between a reference voltage on node 104 from resistor stack 18 and an input voltage received from lead 20. The first split current is the current flowing through the left branch of the attenuator, while the second split current is the current flowing through the right branch of the attenuator. The second split current (through transistor 108) is used to control the current in the ring oscillator. The magnitude of the second split current is mirrored by current mirror 110, with the current generated by the current mirror 110 being used to controls the frequency of the ring oscillator 22.

Attenuator 16 is formed by a differential pair of N-channel transistors 92 and 94. Gate 96 of N-channel transistor 92 is coupled to reference voltage source (resistor stack) 18, and gate 98 of N-channel transistor 94 is coupled to lead 20 from an input voltage filter or other voltage source (not shown).

The attenuator 16 compares the input voltage on node 20 to the reference voltage on node 104 so as to vary the second split current to drive ring oscillator 22 at the desired frequency. If the input voltage on node 20 is greater than the reference voltage on node 104, more current is drawn through N-channel transistor 94 than N-channel transistor 92 and thus the second split current is larger than the first split current. As a result, more current is drawn through P-channel transistor 108 and current mirror 110 as the input voltage increases, and the amount of current mirrored into ring oscillator 22 also increases.

Conversely, as the input voltage on node 20 decreases, the second split current through N-channel transistor 94 decreases and, as a result, less current is drawn through P-channel transistor 108 and current mirror 110 and the current mirrored into ring oscillator 22 decreases. Thus, once the currents of the two current sources are combined and modulated by the attenuator, the resulting current through the right branch of the attenuator tracks the current needs of the current starved inverters of ring oscillator 22.

The current control voltage output from attenuator 16 is coupled to current mirror 110 at gate 112 of P-channel transistor 114. Current mirror 110 mirrors the current in P-channel transistor 108 to ring oscillator 22. The output from current mirror 110 on node 138 controls the current-starved inverters in ring oscillator 22. The use of current mirror 110 between the attenuator and the ring oscillator helps prevent voltage drift in ring oscillator 22 and greatly improves the noise immunity of the ring oscillator.

As shown in FIG. 1, ring oscillator 22 is formed by multiple delay cells 116. Each delay cell 116 is formed by a CMOS inverter 118 and two current control transistors: N-channel 120 and P-channel 122 transistor. A detailed description of a conventional ring oscillator circuit is found in Yousefi-Elezei (U.S. Pat. No. 5,136,260), which is herein incorporated by reference. The gate of the P-channel current control transistor 122 of every delay cell 116 is coupled to output node 138 of the current mirror, and the gate of the N-channel current control transistor 120 of every cell is coupled to node 140. Transistor 130 generates a voltage on node 140 such that the N-channel transistors 120 of the delay cells conduct the same amount of current as the P-channel transistors 122. The signal input of each delay cell 116 is coupled to output of the preceding delay cell 116 in series. The output from the last delay cell is the output of the VCO 10. As is conventional, this output is coupled to a divider (not shown) and then to a phase detector (not shown) to form a phase lock loop.

The voltages on nodes 138 and 140 can also be used to control other delay cells elsewhere in the phase lock loop system. Also, clock signals from taps on any or all of the ring oscillator delay cells can be used as synchronization signals elsewhere in the phase lock loop.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A voltage controlled oscillator circuit comprising:
   a first current source for providing a substantially constant current independent of process, temperature and supply voltage;
   a second current source for providing a variable current that varies in response to process, temperature and supply voltage;
   an attenuator, coupled to said first current source and said second current source so as to subtract said second current from said first current to produce a compensated net current, said attenuator including a differentiation circuit that attenuates said compensated net current by splitting said net current into first and second split currents in accordance with an input voltage and a reference voltage and converting said second split current into a control current signal; and
   a multistage ring oscillator including a plurality of series-connected inverter stages, the ring oscillator responsive to said control current signal for controlling the frequency of oscillation of the ring oscillator;
   wherein said first current source and said second current source respectively generate said constant current and variable current independent of said input voltage.

2. A voltage control oscillator circuit as recited in claim 1, further comprising:
   a current mirror for receiving said control current signal from said attenuator and mirroring said control current signal to said ring oscillator.

3. A voltage control oscillator circuit as recited in claim 2, wherein said constant current generated by said first current source varies less than approximately 11% for a predefined range of processes, temperatures and supply voltages.

4. A voltage control oscillator circuit as recited in claim 2, wherein said first current source comprises:
   a precision current setting resistor;
   a reference voltage source;
   an amplifier coupled to said precision current setting resistor and said reference voltage source so as to generate a current signal, comprising said constant current, which is substantially independent of process, temperature and supply voltage.

5. A voltage control oscillator circuit as recited in claim 2, wherein said second current source comprises:
   a reference voltage source;
   a N-channel MOS transistor coupled to said reference voltage source; and
   a P-channel MOS transistor coupled to said reference voltage source;
   wherein said N-channel transistor provides approximately half of the current output from said second current source and said P-channel transistor provides approximately half of the current output from said second current source for a predefined ideal process, supply voltage and temperature.

6. A voltage control oscillator circuit as recited in claim 2, wherein said attenuator comprises:
   a first N-channel transistor coupled to a reference voltage source; and
   a second N-channel transistor coupled to said input voltage;
   wherein said attenuator compares said input voltage to said reference voltage and generates said current control signal so as to correspond to (A) the difference between said input voltage and said reference voltage, as well as to (B) said net current.

7. A voltage control oscillator circuit as recited in claim 1, wherein said constant current generated by said first current source varies less than approximately 11% for a predefined range of processes, temperatures and supply voltages.

8. A voltage control oscillator circuit as recited in claim 1, wherein said first current source comprises:
   a precision current setting resistor;
   a reference voltage source;
   an amplifier coupled to said precision current setting resistor and said reference voltage source so as to generate a current signal, comprising said constant current, which is substantially independent of process, temperature and supply voltage.

9. A voltage control oscillator circuit as recited in claim 1, wherein said second current source comprises:
   a reference voltage source;
   a N-channel MOS transistor coupled to said reference voltage source; and
   a P-channel MOS transistor coupled to said reference voltage source;

wherein said N-channel transistor provides approximately half of the current output from said second current source and said P-channel transistor provides approximately half of the current output from said second current source for a predefined ideal process, supply voltage and temperature.

10. A voltage control oscillator circuit as recited in claim 1, wherein said attenuator comprises:
   a first N-channel transistor coupled to a reference voltage source; and
   a second N-channel transistor coupled to said input voltage;
   wherein said attenuator compares said input voltage to said reference voltage and generates said current control signal so as to correspond to (A) the difference between said input voltage and said reference voltage, as well as to (B) said net current.

11. A method of generating an oscillating clock signal, the method comprising the steps of:
   receiving an input voltage signal;
   generating a substantially constant current independent of process, temperature and supply voltage and independent of said input voltage signal;
   generating a variable current that varies in response to process, temperature and supply voltage and independent of said input voltage signal;
   subtracting said second current from said first current to produce a compensated net current, and attenuating said compensated net current by splitting said net current into first and second split currents in accordance with said input voltage signal and a reference voltage and converting said second split current into a control current signal; and
   providing current, in accordance with said control current signal, to a current-starved multistage ring oscillator to generate an oscillating clock signal.

12. The method of claim 11,
   said step of providing current to said current-starved multistage ring oscillator including mirroring said second split current to said current-starved multistage ring oscillator.

13. The method of claim 11,
   wherein said attenuating step including comparing said input voltage signal to said reference voltage and generating said current control signal so as to correspond to (A) the difference between said input voltage signal and said reference voltage, as well as to (B) said net current.

* * * * *